(12) United States Patent
Ishiguro et al.

(10) Patent No.: US 6,800,807 B2
(45) Date of Patent: Oct. 5, 2004

(54) ELECTRIC JUNCTION BOX AND PROCESS FOR PRODUCING THE SAME

(75) Inventors: Masaaki Ishiguro, Shizuoka (JP); Akiyoshi Sato, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/606,857

(22) Filed: Jun. 27, 2003

(65) Prior Publication Data

US 2004/0065463 A1 Apr. 8, 2004

(30) Foreign Application Priority Data

Jun. 28, 2002 (JP) ........................................ 2002-189477

(51) Int. Cl.$^7$ .............................. H02G 3/08; H02G 3/16
(52) U.S. Cl. ........................... 174/50; 174/52.1; 174/59; 439/76.2
(58) Field of Search ........................... 174/50, 52.1, 59, 174/52.4, 70 B, 71 B, 72 B, 88 B, 99 B, 129 B, 149 B, 60, 68.2; 439/212, 76.2, 65, 74, 76.1, 979; 361/611, 600, 614; 220/3.2, 3.8, 4.02; 363/144

(56) References Cited

U.S. PATENT DOCUMENTS

| | | | | |
|---|---|---|---|---|
| 5,207,591 A | * | 5/1993 | Ozaki et al. | ................. 439/212 |
| 5,295,842 A | * | 3/1994 | Ozaki et al. | ................... 174/59 |
| 5,393,934 A | * | 2/1995 | Mori et al. | ................ 174/99 B |
| 5,902,138 A | * | 5/1999 | Murakami | .................. 439/76.2 |
| 6,043,431 A | * | 3/2000 | Kato | .......................... 439/76.1 |
| 6,162,990 A | * | 12/2000 | Sakamoto | ..................... 174/59 |
| 6,290,509 B1 | * | 9/2001 | Hattori et al. | ............. 439/76.2 |
| 6,506,060 B2 | * | 1/2003 | Sumida et al. | ............. 439/76.2 |
| 6,583,353 B2 | * | 6/2003 | Murakoshi et al. | ........... 174/50 |
| 6,607,115 B2 | * | 8/2003 | Kobayashi et al. | ........... 174/59 |
| 6,616,461 B2 | * | 9/2003 | Bellinghausen et al. | ...... 439/74 |

* cited by examiner

Primary Examiner—Dean A. Reichard
Assistant Examiner—Angel R. Estrada
(74) Attorney, Agent, or Firm—Armstrong, Kratz, Quintos, Hanson & Brooks, LLP

(57) ABSTRACT

An electric junction box is provided, by which the circuit density can be increased and the whole structure can be lightweight and compact. The electric junction box includes: an insulating board; and a plurality of electrically conductive metal wire rods having a square or a nearly square shape in cross section, which are arranged on the insulating board, wherein an end of at least one of the metal wire rod extends curvedly or straight forming a terminal part and at least a portion of the terminal part protrudes toward a housing of a body of the electric junction box. At least one of the metal wire rods is cut to a suitable length, bent into a suitable shape, and arranged on the insulating board. One terminal part of the metal wire rod protrudes toward the housing, while an opposite terminal part of the at least one metal wire rods is connected to a component or terminal or, alternatively, protrudes toward another housing.

12 Claims, 3 Drawing Sheets

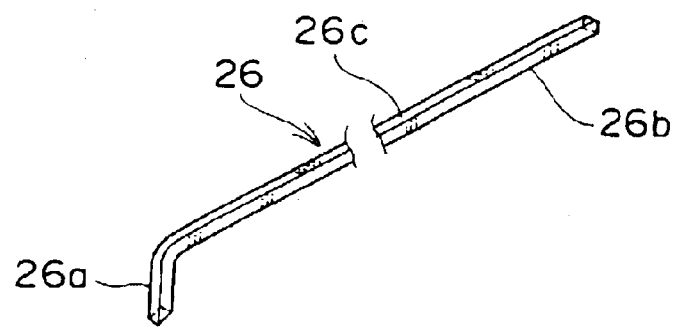
F I G. 2
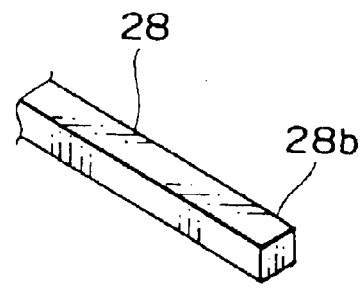
F I G. 3A
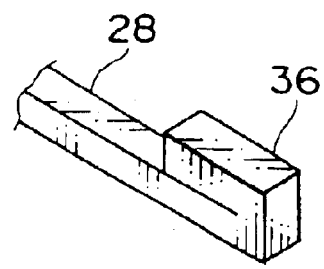
F I G. 3B
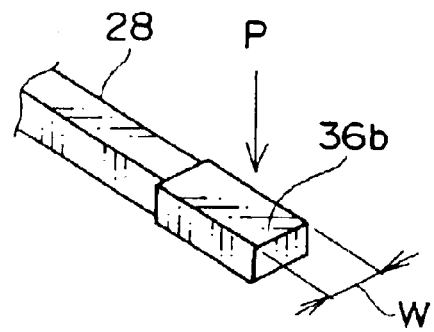
F I G. 3C

ELECTRIC JUNCTION BOX AND PROCESS FOR PRODUCING THE SAME

BACKGROUND OF THE INVENTION (1) Field of the Invention

The present invention relates to an electric junction box, in which an internal circuit is constructed by using a metal wire rod having a quadrangular cross section, and a process for producing the electric junction box.

(2) Description of the Related Art

In a conventional Junction box, a band plate-shaped busbar or a round-shaped insulator-coated electric wire is arranged in a case or cover made of synthetic resin so as to form a circuit, and then an electric component such as relay and fuse, an electronic component such as an electronic unit, and an electric connector of an external wiring harness are connected to the circuit.

The busbar is punching-molded by pressing from an electrically conductive metal plate, has a rectangular shape that is wide in its cross section, and is bent in the width direction of the metal plate upon the punching in response to a form of the circuit. At necessary positions of the busbar, a terminal part having a male tab-shape is integrally formed standing up and down.

A plurality of busbars are arranged on an insulating board made of synthetic resin, a plurality of busbar wiring boards, each consisting of the insulating board and the busbars, are laminated, a terminal part of the busbar situated at a lower layer penetrates through a hole of the insulating board situated at an upper layer while a terminal part of the busbar situated at an upper layer penetrates through a hole of the insulating board situated at a lower layer, and each terminal part protrudes in a connector housing, toward a relay-mounting part or toward a fuse-mounting part of a case. The connector housing and the terminal constitute a connector. The terminal part is connected to the relay or the fuse through a relay terminal.

When an electric wire (hereinafter, wire) is used instead of a busbar or when a wire is used together with a busbar, the wire is arranged on the insulating board in a required form, for example, one plate-shaped terminal is pressure-welded or welded to the wire while an opposite terminal is made protrude in the connector housing or toward the relay-mounting part and so on. The opposite terminal is connected to a relay or a fuse through a relay terminal.

The busbar or the wire may be connected to a solenoid valve, various sensors or switches instead of a relay or fuse. For example, that is a case of an automatic gearing module of a motor vehicle, in which the module includes a function of the electric junction box.

However, in the conventional electric junction box described above, because the busbar should be punching-molded into various bent shapes in accordance with respective forms of the circuit, the mold for the molding must be renewed whenever the form of the circuit is changed, causing an increase in cost. Further, the busbar having a shape wider than that of a wire makes the circuit density limited, causing an increase in weight and size of the busbar wiring board and a case which receives the busbar wiring boards. Furthermore, although the busbar is capable of conducting a large current, the busbar is not suitable for a small current such as a signal current, in a case of which an insulator-coated electric wire having a small diameter is required, causing many man-hours for connecting a terminal to a wire by pressure-welding or welding.

SUMMARY OF THE INVENTION

It is therefore an objective of the present invention to solve the above problems and to provide an electric junction box and a process for producing the electric junction box, by which a cost for processing the busbar per a form of the circuit can be reduced, the man-hour for connecting a terminal to a wire can be reduced, the circuit density can be increased, or the whole structure can be lightweight and compact.

In order to attain the above objective, the present invention provides an electric junction box comprising:

an insulating board; and a plurality of electrically conductive metal wire rods each having a square or nearly square shape in cross section, which are arranged on the insulating board, wherein an end of the metal wire rods extends curvedly or straight forming a terminal part and at least a portion of the terminal part protrudes toward a housing of a body of the electric junction box.

With the construction described above, because the width of the metal wire rod is less than that of a conventional busbar, a circuit of the metal wire rod can be arranged on the insulating board with high density and the structure of the circuit can be lightweight and compact provided that the number of the circuits is the same as that in a busbar. Further, because the end of the metal wire rod is extended curvedly or straight, the terminal part can be easily formed. Furthermore, because the terminal part is protruded in the housing, a connector for connecting to a mating connector and a mount (connecting part) for a relay or fuse can be formed.

With the construction described above, the electric junction box can be easily securely mounted in a narrow space for mounting in a motor vehicle, for example. Further, because there is no need to use a mold for molding a terminal part standing up at the middle portion in the longitudinal direction of a busbar in case of the conventional busbar, the cost of the mold can be eliminated.

Preferably, the metal wire rod is cut to a suitable length, bent into a suitable shape, and arranged on the insulating board.

With the construction described above, the metal wire rod is bent according to the position of an electric component such as relay, fuse and sensor, an electronic component such as a memory, and a connector for connection, thereby effectively attaining an electric connection in the nearest distance. Further, the metal wire rod is cut to a suitable length and bent into a suitable shape at a specific position according to the form of the circuit, thereby enabling an easy response to a change in the circuit form. Furthermore, a period of time required from designing to completion of the electric junction box can be reduced.

Preferably, one terminal part of the metal wire rod protrudes toward the housing, while an opposite terminal part of the metal wire rod is connected to a component or a terminal or, alternatively, protrudes toward another housing.

With the construction described above, the one terminal part can function as a connector for connecting to a mating connector or a mount for a relay and fuse, while the opposite terminal part can function as a connection part for an electronic component or a part such as a sensor or, alternatively, a connector for connecting to a mating connector or a mount for a relay and fuse, thereby attaining various forms of the circuit connection. Further, the connection to various electric equipment or an auxiliary in a motor vehicle can be easily attained.

Preferably, a terminal is directly connected to a middle portion in the longitudinal direction of the metal wire rod.

With the construction described above, for example, a terminal for ground or a terminal for power supply is directly connected to the middle portion in the longitudinal direction of the metal wire rod not having a terminal part at one end or both ends or the metal wire rod having a terminal part at one end or both ends by welding and so on, thereby enabling joint connection among a plurality of the circuits and attaining various forms of the circuit connection. Further, many components and circuits in a motor vehicle can be connected compactly.

Preferably, the end of the metal wire rod is folded and compressed into a plate-shape, thereby forming the terminal part.

With the construction described above, the contact area of the terminal part can increase, thereby reducing the resistance for electric conduction to a mating terminal (female terminal) and enabling to easily correspond to a mating terminal having an existing shape (i.e. no need to change a shape of a mating terminal).

Preferably, the metal wire rod is subjected to tinning.

With the construction described above, the metal wire rod including the terminal part is prevented from being oxidized, thereby improving the electric conduction property of the terminal part (reducing the electrical resistance). Further, sliding property of the terminal part with respect to a mating terminal can be improved, thereby reducing the resistance force for insertion.

Preferably, the metal wire rod has 0.025 inches on a side.

With the construction described above, because the diameter of the metal wire rod is small, the circuit density can be increased and the structure can be compacted. Further, a small current such as a signal current can be supplied or grounded.

In order to attain the above objective, the present invention provides a process for producing an electric junction box comprising the steps of:

- extending curvedly or straight an end of a plurality of electrically conductive metal wire rods having square or nearly square shape in cross section, thereby forming a terminal part;
- arranging a plurality of the metal wire rods on an insulating board; and
- protruding at least a portion of the terminal part toward a housing of a body of the electric junction box.

With the construction described above, because the width of the metal wire rod is less than that of a conventional busbar, a circuit of the metal wire rod can be arranged on the insulating board with high density and the structure of the circuit can be lightweight and compact provided that the number of the circuits is the same as that in a busbar. Further, because the end of the metal wire rod is extended curvedly or straight, the terminal part can be easily formed. Furthermore, because the terminal part is protruded in the housing, a connector for connecting to a mating connector and a mount (connecting part) for a relay or fuse can be formed.

With the construction described above, the electric junction box can be easily securely mounted in a narrow space for mounting in a motor vehicle, for example. Further, because there is no need to use a mold for molding a terminal part standing up at the middle portion in the longitudinal direction of a busbar in case of the conventional busbar, the cost of the mold can be eliminated.

Preferably, the metal wire rod is cut to a suitable length, bent into a suitable shape, and arranged on the insulating board.

With the construction described above, the metal wire rod is bent according to the position of an electric component such as relay, fuse and sensor, an electronic component such as a memory, and a connector for connection, thereby effectively attaining an electric connection in the nearest distance. Further, the metal wire rod is cut to a suitable length and bent into a suitable shape at a specific position according to the form of the circuit, thereby enabling an easy response to a change in the circuit form. Furthermore, a period of time required from a designing to a completion of the electric junction box can be reduced.

Preferably, one terminal part of the metal wire rod protrudes toward the housing, while an opposite terminal part of the metal wire rod is connected to a component or a terminal or, alternatively, protrudes toward another housing.

With the construction described above, the one terminal part can function as a connector for connecting to a mating connector or a mount for a relay and fuse, while the opposite terminal part can function as a connection part for an electronic component or a part such as a sensor or, alternatively, a connector for connecting to a mating connector or a mount for a relay and fuse, thereby attaining various forms of the circuit connection. Further, the connection to various electric equipment or an auxiliary in a motor vehicle can be easily attained.

Preferably, a terminal is directly connected to a middle portion in the longitudinal direction of the metal wire rod.

With the construction described above, a terminal for ground or a terminal for power supply is directly connected to the middle portion in the longitudinal direction of the metal wire rod not having a terminal part at one end or both ends or the metal wire rod having a terminal part at one end or both ends by welding and so on, thereby enabling joint connection among a plurality of the circuits and attaining various forms of the circuit connection. Further, many components and circuits in a motor vehicle can be connected compactly.

Preferably, the end of the metal wire rod is folded and compressed into a plate-shape, thereby forming the terminal part.

With the construction described above, the contact area of the terminal part can increase, thereby reducing the resistance for electric conduction to a mating terminal (female terminal) and enabling to easily correspond to a mating terminal having an existing shape (i.e. no need to change a shape of a mating terminal).

BRIEF DESCRIPTION OF THE DRAWINGS

FIG. 2 is a perspective view illustrating an embodiment of a metal wire rod to be used;

FIGS. 3A, 3B and 3C are perspective views illustrating an embodiment of a process for forming a terminal part in sequence.

DESCRIPTION OF THE PREFERRED EMBODIMENTS

In the following, the preferred embodiments of the present invention will be explained with reference to the attached drawings.

Figure 1:
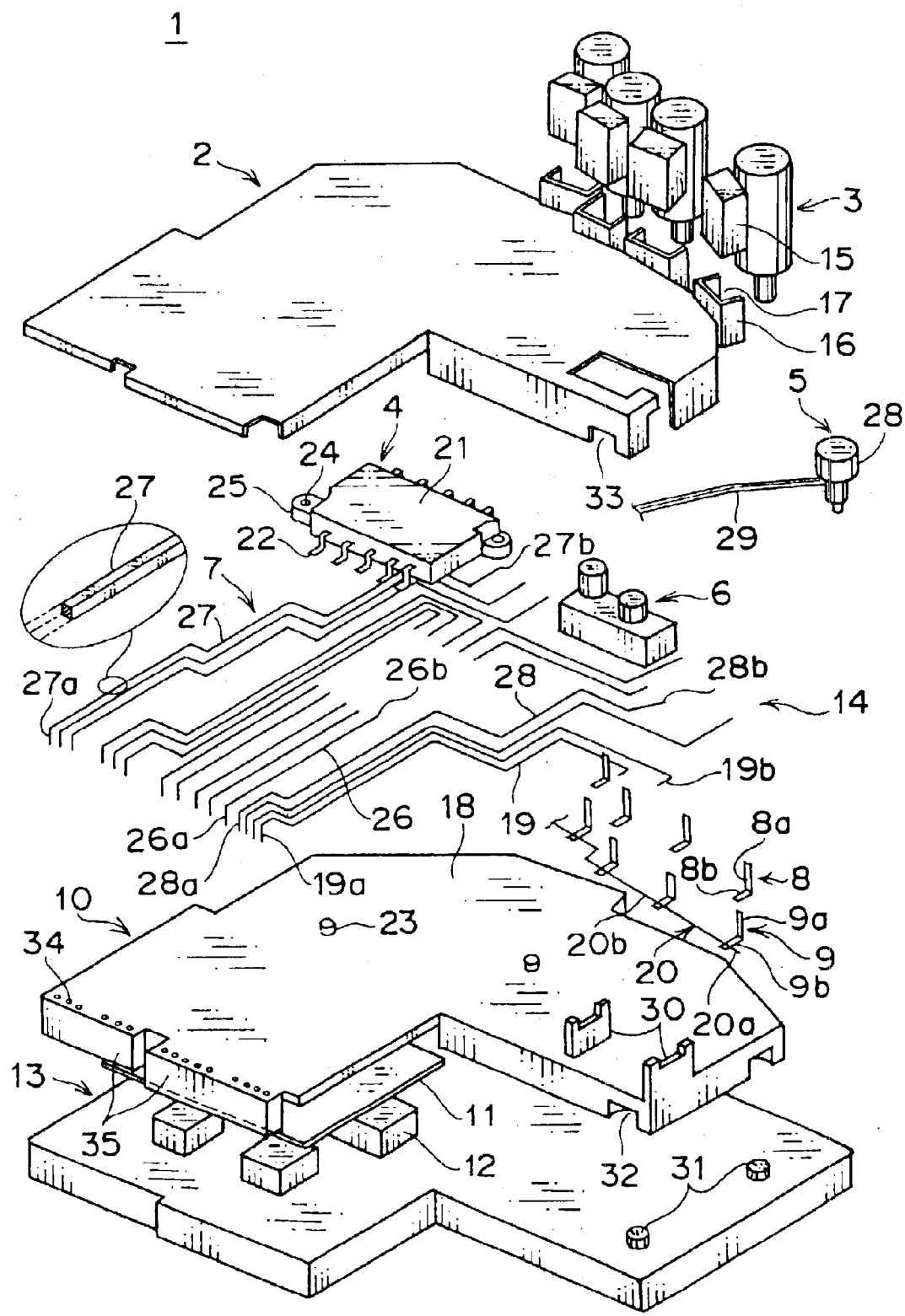
FIG. 1 is an exploded perspective view illustrating a preferred embodiment of an automatic gearing module including an electric junction box according to the present invention.

FIG. 1 is an exploded perspective view illustrating a preferred embodiment of an automatic gearing module including an electric junction box according to the present invention.

The automatic gearing module 1 includes in turn from the top: a cover 2 made of synthetic resin; a plurality of solenoid valves 3; a component such as an electronic component (ROM, i.e., memory unit) 4, oil temperature sensor 5 and rotation sensor 6; a plurality of electrically conductive metal wire rods 7, each having a quadrilateral shape (square or nearly square shape) in cross section; terminals 8 and 9 for connecting the solenoid valve; a base 10 made of insulating resin; a plate 11 made of insulating resin; a plurality of oil pressure switches (components) 12; and a control valve assembly 13.

An electric junction box includes at least the cover 2, solenoid valve 3, electronic component 4, various sensors (components) 5 and 6, a plurality of the metal wire rods 7, terminals 8 and 9, and base 10. The cover 2 and base 10 constitute a body of the electric junction box.

A connector part 15 of the solenoid valve 3 is inserted into a frame wall 16 of the cover 2. The frame wall 16 has openings 17 at the top, bottom and the front thereof, and the connector part 15 is inserted into the frame wall 16 from the opening 17. The connector part 15 has an opening (not shown) for receiving the terminal 8 of a power supply-side and the terminal 9 of ground-side at the bottom.

The terminals 8 and 9 are bent into a L-shape by a conductive metal plate and have perpendicular electric contacts 8a and 9a protruding upward and horizontal connection parts 8b and 9b, which are fixed to the a surface of a horizontal insulating plate 18 of the base 10, respectively. The upward electric contacts 8a and 9a advance into the connector part 15 and are connected to female terminals (not shown) in the connector part. The electric contacts 8a and 9a situated at the bottom side are directly connected to a horizontal end (terminal part) 27b of a metal wire rod 27 having a square shape in cross section situated at the power supply-side, an end 20a of a metal wire rod 20 having a square shape in cross section situated at ground-side or a middle portion in the longitudinal direction thereof with solder or by welding. The terminal (8) may be directly connected to a middle portion in the longitudinal direction of the metal wire rod 27 which has a terminal part 27a for a connector.

The electronic component 4 includes a body 21 made of insulating resin, an electronic element (not shown) arranged in the body 21, and a plurality of metal terminal 22 protruding from the front and rear ends of the body 21, wherein the terminal 22 is connected to the electronic element. A bracket 25 is protrudingly formed at right and left ends of the body 21, wherein the bracket 25 has a hole 24 for engaging with a projection for positioning on a surface of the insulating plate 18 of the base 10. The terminal 22 is formed in a crank-shape including a short projection protruding in the horizontal direction from the body 21, a perpendicular part extending downward from the projection, and a short contact part protruding outward in the horizontal direction from the perpendicular part. The contact part of the terminal 22 is directly connected to a horizontal terminal part 26b of the metal wire rod 26 having a square shape in cross section with solder or by welding.

The oil temperature sensor 5 includes a body 28 and a lead 29, wherein the body 28 is fixed to the control valve assembly 13 and an end of the lead 29 is connected to a horizontal end (terminal part) 28b of the metal wire rod 27 having a square shape in cross section with solder, by welding or through a female terminal. The rotation sensor 6 is fixed on a support 30 of the base 10 and similarly connected to an end (terminal part) 27b of the metal wire rod 27.

The oil pressure switch 12 is disposed between the plate 11 and the control valve assembly 13. The plate 11 is mounted on a lower surface of the base 10. The base 10 is positioned and mounted to the control valve assembly 13 through an engagement between a convex 31 and concave 32. The cover 2 covers the base 10, a plurality of the metal wire rods 7 and the various components 4, 6, and positioned and mounted to the control valve assembly 13 through an engagement between a convex 31 and concave 33.

Each metal wire rod 19, 20, 26–28 (hereinafter, representatively 7) having a square shape in cross section is bent into a suitable shape and arranged in a line on a surface of the insulating plate 18 of the base 10. The metal wire rod 7 has a small width unlike a conventional busbar, thereby enabling construction of many circuits, in order to increase the density of the circuit and to make the automatic gearing module 1 more compact.

Each metal wire rod 7 is fixed to the base 10 by fitting it into a groove (not shown) formed on a surface of the base, by being held between a pair of holding pieces (not shown) protruding from the base 10 or by integrally burying it in the base 10 by insert molding.

If the metal wire rod 7 crosses the other metal wire rod 7 on the base 10, the metal wire rod 7 is bent in the upward and downward directions so as to avoid contact. A known metal wire rod having a square shape can be used and is extendingly formed not by pressing but by using a dies. In the automatic gearing module 1, for example, the metal wire rod 7 preferably has a square or nearly square shape in cross section having 0.025 inches (0.64 mm) on a side. Here, the nearly square shape means a shape close to a rectangle shape.

The metal wire rod 7 is made of copper or copper alloy. A surface of the metal wire rod 7 is preferably subjected to tinning (not shown) from the viewpoint of corrosion prevention, solder duration of the terminal parts 19a, 19b, 20a, 26a, 27a, 28a and 28b, and smooth insertion into a mating female terminal. The tinning may be subjected to only the terminal part, that is, the end of the metal wire rod 7.

In the preferred embodiment as shown in FIG. 1, one end of the metal wire rod 19, 26–28 is bent downward perpendicularly so as to be one terminal part 19a, 26a–28a, respectively. The one terminal part 19a, 26a–28a penetrates through a hole 34 of the insulating board 18 of the base 10 and is inserted into a connector fitting space of a connector housing (i.e., housing) 35 situated at lower side. The connector fitting space Continues to an opening (not shown) situated at lower side. The two connector housings 35 are formed nearly in a line at right and left at one side of the base 10. The male terminals 19a, 26a–28a and the female connector housing 35 constitute a female connector. For example, a connector (not shown) of an external wiring harness is fittingly connected into a connector fitting space of each connector from an opening situated at a lower side.

As shown in FIG. 2, the terminal part 26a of the metal wire rod 26 (representatively denoted by 26) is formed being bent downward from a body part 26c, which is long in the horizontal direction of the metal wire rod 26. Thus, the metal wire rod 26 is only bent with a specific length, thereby forming the terminal part 26a easily with a low cost.

A female terminal (not shown) in a mating male connector is inserted into and connected to the one terminal part 26a, that is, the terminal part for constituting a connector. The female terminal has a resilient contact piece in an electric contact part having a rectangular cylindrical shape, for example. The metal wire rod 26 is thin having 0.025 inches on a side, for example, and the terminal part 26a has the same thickness as that, therefore the mating female terminal can be thin as well and not only a connector (connector housing 35) at the base-side but also a mating connector can be compact.

The body of each metal wire rod 7 shown in FIG. 1 is bent into a suitable shape in the horizontal direction according to a shape of the base and so on. If there is no interference depending on the shape of the base or the arrangement of the components, the body of the metal wire rod 7 can be formed straight. If the metal wire rod 7 is set to cross the other metal wire rod 7, as described above, the metal wire rod 7 is bent in the perpendicular direction so that the metal wire rod 7 situated at the upper side can pass through horizontally without any contact above the horizontal metal wire rod 7 situated at lower side.

In FIG. 2, the opposite end of the metal wire rod 26 is situated on the extension of the horizontal body and is used as the terminal part 26b. Depending on the connection direction, the opposite end 26b of the metal wire rod 26 may be bent upward or downward so as to form a terminal part in the perpendicular direction, which is similar to the one end 26a. An end of the terminal part 26a, 26b may be formed, for example, tapered so as to have no edge.

In FIG. 1, the opposite terminal part 26b of the metal wire rod 26 is connected to a terminal 22 of an electronic component 4 with solder, the terminal part 28b of the metal wire rod 28 is connected to a lead 29 of the oil temperature sensor 5 with solder or through a terminal, the terminal part 29b of the metal wire rod 29 is connected to a terminal of the rotation sensor 6 with solder or through a terminal, and the terminal part 27b of the metal wire rod 27 is connected to a terminal 8 for connection of the solenoid at the power supply-side with solder.

If a terminal at the mating side needs to come in contact with one and/or opposite terminal part of the metal wire rod 7 with a wide-width area similarly to a busbar, as shown in FIGS. 3A–3C, the end 28b of the metal wire rod 28 (representatively denoted by 28) having a square shape in cross section is folded in the thickness direction (i.e., height direction) and the end including the folded part 36 is crushed by pressing in the thickness direction from the above as shown in arrow P, thereby forming a flat terminal part 36b having wide width W. The thickness of the terminal part 36b may be the same as that of the body part of the metal wire rod 28, or thicker or thinner than that.

The wide terminal part 36b can be applied not only to a horizontal terminal part but also to a perpendicular terminal part 27a as shown in FIG. 1. In such a case, the connector housing 35 is provided with a wide opening (34) for receiving a terminal.

Further, in FIG. 1, a horizontal terminal part may be extendingly formed straight at an end of the horizontal metal wire rod 7 so that the terminal part protrudes horizontally in a connector housing (not shown) situated in the horizontal direction.

The above-mentioned constructions explained with reference to FIGS. 1, 2, 3A, 3B and 3C are effective as a process for producing a circuit for an electric junction box or an electric junction box.

Figure 4:
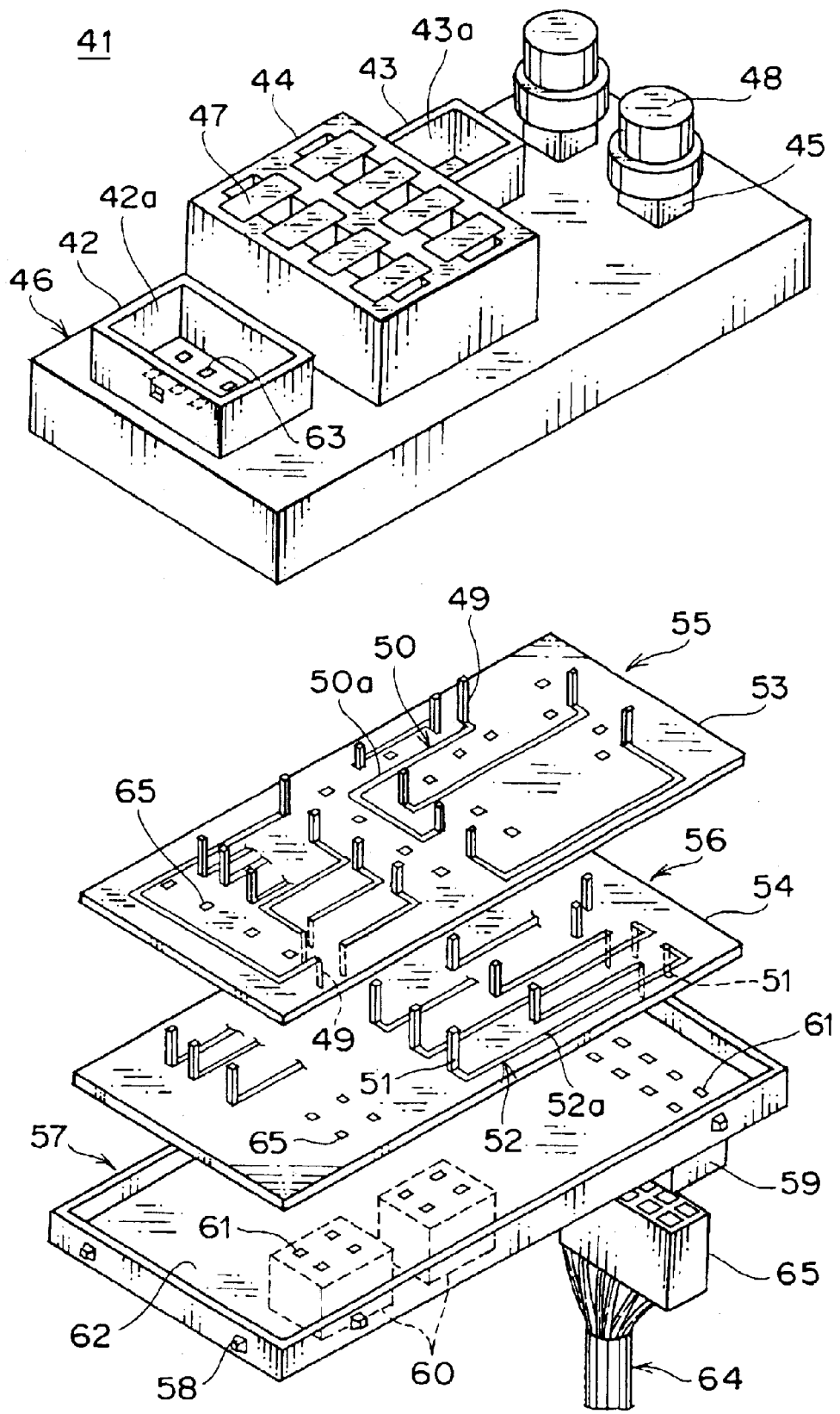
FIG. 4 is an exploded perspective view illustrating another preferred embodiment of an electric junction box according to the present invention.

FIG. 4 is an exploded perspective view illustrating another preferred embodiment of an electric junction box according to the present invention, which is disposed around an instrument panel or in an engine room and connects a connector of a wiring harness, relay, fuse and so on.

An electric junction box 41 includes: an upper cover 46 made of synthetic resin having connector housings (housings) 42, 43 and electric component mounts (housings of relay mount and fuse mount) 44, 45; electric components such as a fuse 47 and relay 48 to be mounted on the electric component mounts 44, 45; a plurality of metal wire rods 50, 52 having a quadrangular shape (square or nearly square) in cross section having a terminal part 49, 51 protruding in the connector housing 42, 43 or the electric component mount 44, 45; a plurality of insulating boards 53, 54 on which the metal wire rod 50 is arranged; and a lower cover 57 made of synthetic resin for receiving a plurality of circuit arranging board 55, 56 consisting of the metal wire rods 50, 52 and the insulating board 53, 54 into a space between the upper cover 46 and the lower cover 57.

The upper cover 46 and lower cover 57 are locked by locking means 58 constituting a body of the electric junction box. The connector housings 59, 60 are formed integrally with the lower cover 57. A plurality of terminal insertion holes 61, which continue to a connector fitting space of the connector housing 59, 60, are formed in a base wall 62 of the lower cover 57. A plurality of terminal insertion holes 63, which continue to a connector fitting space 42a, 43a of the connector housing 42, 43, are formed in a base wall of the upper cover 46. The connector housings 42, 43, 59, 60 of the covers 46, 57 and the male terminal parts 49, 51 constitute a female connector. A male connector 65 of an external wiring harness is fittingly connected to the connector of both covers 46, 57. A female terminal is received in the male connector 65 and each terminal is connected to an electric wire.

The metal wire rod 50, 52 has a square or nearly square shape in cross section and is bent in the horizontal direction into a suitable shape according to the positions of the fuse mount 44, relay mount 45 and connector housings 42, 43, 59, 60 integrally having the terminal part 49, 51, which rises up or down at an end of the metal wire rod 50, 52.

The terminal part 49, 51 is formed at both ends of the wire rod body 50a, 52a. One terminal part 49, 51 of the wire rod body 50a, 52a is bent upward or downward and an opposite terminal part 49, 51 of the wire rod body 50a, 52a is bent upward or downward. The metal wire rod 50, 52 is only bent in the perpendicular direction, thereby easily forming the terminal part 49, 51. As shown in FIG. 3, the terminal part may be formed into a flat plate-shape by pressing.

The length of a side of the metal wire rod 50, 52 is not necessarily limited to be 0.025 inches but can be a suitable size according to a capacity of a fuse 47, relay 48 and connector terminal. The width of the metal wire rod is significantly less than that of a conventional busbar. The dimension in cross section of the metal wire rod 50, 52 situated up and down is the same. The metal wire rod 50, 52 may be used together with a busbar.

The metal wire rod 50, 52 is arranged on a surface of the insulating board 53, 54. Preferably, the insulating board 53, 54 is provided with a groove or holding piece (not shown) for positioning and fixing the metal wire rod 50, 52 thereon. The insulating board 53, 54 is provided with a hole 65 for inserting the terminal part 49, 51 upward or downward therethrough. The terminal part 49, 51 is press fitted into the hole 65, thereby the metal wire rod 50, 52 may be fixed on the insulating board 53, 54.

The circuit arranging boards 55, 56, each consisting of a plurality of the metal wire rods 50, 52 and the insulating board 53, 54, are laminated. The upward terminal part 51 of the circuit arranging board 56 situated at the lower side penetrates through the hole 65 of the upper insulating board 53 and protrudes in the connector housing 42, 43 or the electric component mount 44, 45 of the upper cover 46 together with the upward terminal part 49 of the circuit arranging board 55 situated at the upper side. Likewise, the downward terminal part 49 of the circuit arranging board 55 situated at the upper side protrudes in the connector housing 59, 60 of the lower cover 57 together with the downward terminal part 51 of the circuit arranging board 56 situated at the lower side. The lower cover 57 may be provided with an electric component mount (44, 45).

A male tab terminal of the fuse 47 and relay 48 is connected to the terminal part 49, 51 of the metal wire rod 50, 52 through a female-male junction terminal (not shown). One electric contact of the junction terminal is formed having a small diameter to fit with the terminal part 49, 51. The terminal part 49, 51 of the metal wire rod 50, 52 may be compressed into a shape similar to that of the male tab terminal of the fuse 47 or relay 48 as shown in FIG. 3, so that an existing junction terminal can be employed.

Because the metal wire rod 50, 52 is significantly thinner than a busbar, a space for the arrangement on the insulating board 53, 54 can be limited, thereby making the circuit density high. Moreover, the number of the circuit arranging boards 55, 56, each consisting of a plurality of the metal wire rods 50, 52 and the insulating board 53, 54, can be reduced, thereby making the electric junction box 41 small.

The construction as explained above with reference to FIG. 4 is effective for a process for producing a circuit for use in an electric junction box and a process for producing an electric junction box.

The aforementioned preferred embodiments are described to aid in understanding the present invention and variations may be made by one skilled in the art without departing from the spirit and scope of the present invention.

What is claimed is:

1. An electric junction box comprising;
    an insulating board; and
    a plurality of electrically conductive metal wire rods each having a square or a nearly square shape in cross section, which are arranged on the insulating board,
    wherein an end of at least one of the metal wire rods extends curvedly or straight forming a terminal part and at least a portion of the terminal part protrudes toward a housing of a body of the electric junction box.

2. The electric junction box according to claim 1, wherein at least one of the metal wire rods is cut to a suitable length, bent into a suitable shape, and arranged on the insulating board.

3. The electric junction box according to claim 1, wherein one terminal part of at least one of the metal wire rods protrudes toward the housing, while an opposite terminal part of the at least one of the metal wire rods is connected to a component or a terminal or, alternatively, protrudes toward another housing.

4. The electric junction box according to claim 1, wherein a terminal is directly connected to a middle portion in the longitudinal direction of at least one of the metal wire rods.

5. The electric junction box according to claim 1, wherein the end of at least one of the metal wire rods is folded and compressed into a plate-shape, thereby forming the terminal part.

6. The electric junction box according to claim 1, wherein each of the metal wire rods is subjected to tinning.

7. The electric junction box according to claim 1, wherein each of the metal wire rods has a length of 0.025 inches on a side.

8. A process for producing an electric junction box comprising the steps of:
    extending curvedly or straight an end of a plurality of electrically conductive metal wire rods, each having a square or a nearly square shape in cross section, thereby forming a terminal part;
    arranging a plurality of the metal wire rods on an insulating board; and
    protruding at least a portion of the terminal part toward a housing of a body of the electric junction box.

9. The process for producing an electric junction box according to claim 8, wherein at least one of the metal wire rods is cut to a suitable length, bent into a suitable shape, and arranged on the insulating board.

10. The process for producing an electric junction box according to claim 8, wherein one terminal part of at least one of the metal wire rods protrudes toward the housing, while an opposite terminal part of the at least one of the metal wire rods is connected to a component or a terminal or, alternatively, protrudes toward another housing.

11. The process for producing an electric junction box according to claim 8, wherein a terminal is directly connected to a middle portion in the longitudinal direction of at least one of the metal wire rods.

12. The process for producing an electric junction box according to claim 8, wherein the end of at least one of the metal wire rods is folded and compressed into a plate-shape, thereby forming the terminal part.

* * * * *